(12) United States Patent
Yamanoue

(10) Patent No.: US 12,532,770 B2
(45) Date of Patent: Jan. 20, 2026

(54) SWITCHING DEVICE AND SWITCHING MODULE INCLUDING A COMMON MODE CURRENT SUPPRESSION STRUCTURE

(71) Applicant: Mazda Motor Corporation, Hiroshima (JP)

(72) Inventor: Kouichi Yamanoue, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 340 days.

(21) Appl. No.: 18/125,120

(22) Filed: Mar. 23, 2023

(65) Prior Publication Data

US 2024/0030079 A1 Jan. 25, 2024

(30) Foreign Application Priority Data

Jul. 25, 2022 (JP) ................. 2022-118117

(51) Int. Cl.
*H01L 23/31* (2006.01)
*H01L 23/00* (2006.01)
*H01L 23/367* (2006.01)
*H02M 7/00* (2006.01)

(52) U.S. Cl.
CPC ...... *H01L 23/3142* (2013.01); *H01L 23/3675* (2013.01); *H01L 24/48* (2013.01); *H01L 2224/48091* (2013.01); *H02M 7/003* (2013.01)

(58) Field of Classification Search
CPC .................................. H01L 23/3142
USPC ........................................... 257/734
See application file for complete search history.

(56) References Cited

U.S. PATENT DOCUMENTS

| | | | | |
|---|---|---|---|---|
| 2004/0164405 A1* | 8/2004 | Umezu | ........ | H05K 1/0203 |
| | | | | 257/E23.102 |
| 2014/0159225 A1 | 6/2014 | Zushi et al. | | |
| 2018/0042104 A1* | 2/2018 | Nagaoka | ........ | H02M 1/123 |
| 2018/0337107 A1 | 11/2018 | Kida et al. | | |
| 2024/0032266 A1* | 1/2024 | Yamanoue | ........ | H02M 1/123 |

FOREIGN PATENT DOCUMENTS

| | | | | |
|---|---|---|---|---|
| CN | 113098471 A | * | 7/2021 | ........ H03K 17/687 |
| JP | 2018-195694 A | | 12/2018 | |

* cited by examiner

*Primary Examiner* — Ajay Arora
(74) *Attorney, Agent, or Firm* — XSENSUS LLP

(57) ABSTRACT

Provided is a switching device 1 including a drain fin 103 arranged below a semiconductor chip 101 via a common mode current suppression structure 2. The common mode current suppression structure 2 includes a first insulating layer 2a joined on the drain fin 103, an electric conductive layer 2b joined on the first insulating layer 12a, a second insulating layer 2c joined on the electric conductive layer 2b, and an electrode conductor 2d joined on an upper surface of the second insulating layer 2c and joined to a drain electrode 101a of the semiconductor chip 101. The electric conductive layer 2b is electrically connected to a source electrode 101b of the semiconductor chip 101.

19 Claims, 16 Drawing Sheets

SWITCHING DEVICE AND SWITCHING MODULE INCLUDING A COMMON MODE CURRENT SUPPRESSION STRUCTURE

CROSS-REFERENCE TO RELATED APPLICATION

The present application claims priority to Japanese Patent Application No. 2022-118117, filed on Jul. 25, 2022, the entire contents of which are incorporated herein by reference.

BACKGROUND

The technique disclosed herein relates to a switching module, on which switching control is performed. Particularly, the technique disclosed herein relates to a switching device and a switching module suitable for an in-vehicle electric device.

BACKGROUND ART

In recent years, motor vehicles have been increasingly motorized. The number of electric devices mounted on a motor vehicle has been increasing, and there has been a demand for improvement in performance of the electric devices.

Many electric devices used for supplying power, i.e., electric devices related to so-called power electronics, include switching devices and switching modules, which are electronic components on which switching control is performed. For these switching devices and switching modules, the high-speed switching control is required in order to improve the efficiency thereof.

However, when the switching control is performed at high speed, there is a problem that harmonic noise (so-called common mode noise) is generated due to a periodic voltage change associated with such high-speed switching control.

That is, common mode current flows in such an unexpected current path that the common mode flows via a stray capacitance (parasitic capacitance) and the ground (earth). The common mode noise is generated due to the common mode current. The common mode noise would cause malfunction of electric devices located nearby, communication disturbance, etc. For this reason, in order to speed up the switching control, it is inevitable to suppress the common mode noise.

In order to suppress the common mode noise, various techniques have been proposed. For example, Japanese Unexamined Patent Publication No. 2018-195694 discloses a technique of reducing common mode noise generated in a half-bridge circuit configured such that two switching elements are connected in series.

In the case of the half-bridge circuit, a voltage change is great at a midpoint between the two switching elements. Thus, in the technique of Japanese Unexamined Patent Publication No. 2018-195694, a heat sink (second heat sink 19) facing a conductive plate (midpoint conductive plate 15) at the midpoint via an insulating layer 31 is insulated from a ground terminal 24 (for the sake of easy explanation, reference numerals in Japanese Unexamined Patent Publication No. 2018-195694 are used herein for explaining Japanese Unexamined Patent Publication No. 2018-195694).

With this configuration, the common mode noise flowing from the midpoint conductive plate 15 is reduced.

SUMMARY

Technical Problem

The technique of Japanese Unexamined Patent Publication No. 2018-195694 reduces or disperses the stray capacitance (parasitic capacitance) formed between the midpoint conductive plate 15 and the ground terminal 24, thereby reducing the common mode noise.

However, the second heat sink 19 faces, via respective insulators 32, a pair of first heat sinks 18 connected to the ground terminal 24. The common mode current flows from the midpoint conductive plate 15 via these opposing portions. The technique of Japanese Unexamined Patent Publication No. 2018-195694 can reduce the common mode noise, but still generates the common mode noise. Thus, there is still room for improvement.

The technique disclosed herein has an object to provide a switching device and a switching module capable of suppressing common mode noise as much as possible by blocking the flow of common mode current.

Solution to the Problems

One of the techniques disclosed herein relates to a switching device, on which switching control is performed.

The switching device includes: a semiconductor chip, a positive electrode side terminal connected to a first terminal portion provided on the lower surface of the semiconductor chip; a negative electrode side terminal connected to a second terminal portion provided on the upper surface of the semiconductor chip; switching terminal connected to a third terminal portion provided on the upper surface of the semiconductor chip in order to switch whether to flow a current in a current path between the first terminal portion and the second terminal portion; and a heat dissipation conductor arranged below the semiconductor chip via a certain common mode current suppression structure.

The common mode current suppression structure includes a first insulating layer joined on the heat dissipation conductor; an electric conductive layer joined on the first insulating layer; a second insulating layer joined on the electric conductive layer; and an electrode conductor joined on an upper surface of the second insulating layer and joined on a lower surface of the first terminal portion. The electric conductive layer is electrically connected to the second terminal portion.

That is, according to this switching device, the semiconductor chip and the heat dissipation conductor are electrically insulated from each other. Due to the configuration in which the semiconductor chip and the heat dissipation conductor are electrically insulated from each other, a current path, in which common mode current flows when the voltage is intermittently changed by the switching control, would be formed. To suppress such formation of the current path, as an insulating structure, the common mode current suppression structure according to the present disclosure is provided, in which the electric conductive layer electrically connected to the second terminal portion is interposed.

Since the second terminal portion is connected to the negative electrode side terminal, the potential of the electric conductive layer is kept constant. Thus, there is no potential difference between the electric conductive layer and a heat dissipation conductor. Accordingly, no charge is accumulated in the first insulating layer.

As a result, since the common mode current does not substantially flow, the common mode noise can be suppressed as much as possible. Thus, the switching control can be speeded up.

A further one of the techniques disclosed relates to a switching module, on which a switching control is performed.

The switching module includes: a half-bridge circuit including an upper arm chip and a lower arm chip connected with each other in series; and a heat sink arranged below the semiconductor chip via a certain common mode current suppression structure.

The common mode current suppression structure includes a first insulating layer joined on the heat sink; an electric conductive layer joined on the first insulating layer; a second insulating layer joined on the electric conductive layer; and an electrode conductor joined on an upper surface of the second insulating layer and joined on a lower surface of the lower arm chip, and the electric conductive layer is electrically connected to a constant potential portion at which a predetermined potential is held.

That is, according to this switching module, the semiconductor chip and the heat sink are electrically insulated from each other, as in the above-described switching device. Due to the configuration in which the semiconductor chip and the heat dissipation conductor are electrically insulated from each other, a current path, in which common mode current flows when the voltage is intermittently changed by the switching control, would be formed. To suppress such formation of the current path, the common mode current suppression structure according to present disclosure is provided, in which the electric conductive layer electrically connected to the constant potential portion is interposed.

The constant potential portion is held at the predetermined potential. Thus, the potential of the electric conductive layer is kept constant. Thus, there is no potential difference between the electric conductive layer and the heat sink. Accordingly, no charge is accumulated in the first insulating layer.

As a result, since the common mode current does not substantially flow, the common mode noise can be suppressed as much as possible. Thus, the switching control can be speeded up.

More specifically, the constant potential portion may be a portion of a negative electrode side line connected with the half-bridge circuit or a portion of a positive electrode side line connected with the half-bridge circuit.

In the case of further providing two capacitors connected in series between the positive electrode side line and the negative electrode side line to which the half-bridge circuit is connected, the constant potential portion may be a portion between the two capacitors, and the electric conductive layer may be electrically connected to such a portion.

At any of these portions, the predetermined potential is held during execution of the switching control. Thus, the potential of the electric conductive layer can be kept constant if the electric conductive layer is connected to any of these portions.

In each of the switching device and the switching module as described above, the materials of the first insulating layer and the second insulating layer may be ceramic.

With this configuration, excellent thermal conductivity can be imparted to these insulating layers. Accordingly, the semiconductor chip can effectively dissipate heat, and a temperature abnormality can be reduced.

In each of the switching device and the switching module as described above, the materials of the first insulating layer and the second insulating layer may be silicon resin.

With this configuration, the first insulating layer and the second insulating layer excellent in both insulating properties and thermal conductivity can be easily obtained at relatively-low cost.

In each of the switching device and the switching module as described above, the electric conductive layer may be formed by applying a material having fluidity.

With this configuration, the electric conductive layer can be formed by a simple method such as printing.

In each of the switching device and the switching module as described above, the electric conductive layer may be a metallic thin film.

With this configuration, the electric conductive layer can be formed by a method such as sputtering. This allows the electric conductive layer to be formed thin, so that the thermal conductivity can be improved.

In each of the switching device and the switching module as described above, the first insulating layer, the electric conductive layer, and the second insulating layer are stacked on one another.

With this configuration, these layers can be simultaneously formed in the form of a general-purpose printed wiring board. Therefore, the switching device etc. can be easily produced at low cost.

A yet further one of the techniques disclosed relates to a switching device, on which a switching control is performed.

The switching device includes: a semiconductor chip; a positive electrode side terminal connected to a first terminal portion provided on the lower surface of the semiconductor chip; a negative electrode side terminal connected to a second terminal portion provided on the upper surface of the semiconductor chip; and a switching terminal provided on the upper surface of the semiconductor chip and connected to a third terminal portion provided to switch whether to flow a current in a current path between the first terminal portion and the second terminal portion; and a heat dissipation conductor arranged below the semiconductor chip via a certain common mode current suppression structure. The common mode current suppression structure includes an insulating layer joined on the heat dissipation conductor; and an electrode conductor joined on an upper surface of the insulating layer and joined on a lower surface of the first terminal portion. The heat dissipation conductor is electrically connected to the second terminal portion.

As will be described later, even with this structure, the flow of the common mode current can be blocked by a technical idea similar to that of the above-described switching device. Thus, this switching device can also have features and effects similar to those of the above-described switching device.

Advantages of the Invention

According to the switching device and the switching module to which the techniques disclosed herein are applied, since the common mode current does not substantially flow, the common mode noise can be suppressed as much as possible. This allows speeding-up of the switching control, and therefore, the performance thereof can be improved.

DESCRIPTION OF EMBODIMENTS

Hereinafter, embodiments of the technique disclosed herein will be described. It should be noted that the following description is merely illustrative in nature. The technique disclosed herein relates to a switching device and a switching module on which switching control is performed. Thus, these device and module will be described individually.

Switching Device

For the sake of easy understanding of the technique disclosed herein, a switching device (unimproved device 100) before application of the technique disclosed herein will be described as a comparative example.

Unimproved Device

Figure 1:
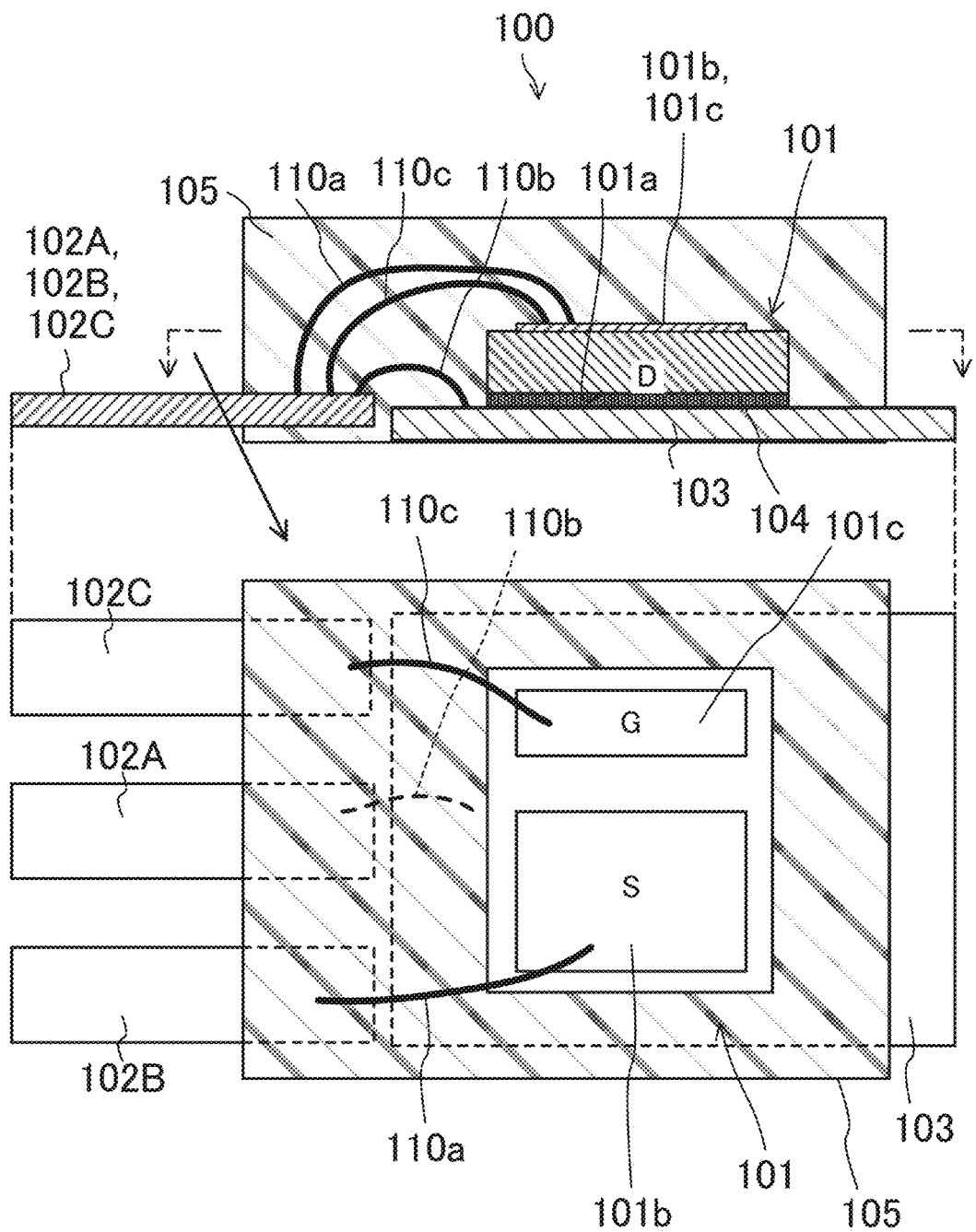
FIG. 1 is a schematic view showing an unimproved device (comparative example).

FIG. 1 illustrates such an unimproved device 100. In the illustration, a power MOSFET is illustrated as an example of a semiconductor chip 101 of the unimproved device 100. The unimproved device 100 is driven with a relatively-high power application. Furthermore, a switching control of turning on and off the unimproved device 100 at high speed is performed. Accordingly, the unimproved device 100 generates heat when operating.

The unimproved device 100 includes the semiconductor chip 101, a plurality of later-described terminals formed of a copper lead frame, and a drain fin 103. The drain fin 103 is formed of a rectangular plate-shaped member, and also serves as a heat dissipation member in order to prevent an excessive temperature increase. That is, the drain fin 103 is a heat dissipation conductor.

The semiconductor chip 101 includes a drain electrode 101a (first terminal portion), a source electrode 101b (second terminal portion), and a gate electrode 101c (third terminal portion). In a case where the semiconductor chip 101 is a bipolar transistor, the drain electrode 101a corresponds to a collector electrode and the source electrode 101b corresponds to an emitter electrode. The gate electrode 101c corresponds to a base electrode.

The drain electrode 101a connected to a positive electrode side having a higher voltage generates a greater amount of heat than the source electrode 101b connected to a negative electrode side having a lower voltage. The lower surface of the semiconductor chip 101 serves as the drain electrode 101a. The drain electrode 101a is bonded (soldered) onto the drain fin 103 with solder 104.

The source electrode 101b and the gate electrode 101c are provided on an upper surface of the semiconductor chip 101. The source electrode 101b is greater in area than the gate electrode 101c used for control.

Three terminals (positive electrode side terminal 102A, negative electrode side terminal 102B, and switching terminal 102C) corresponding to these electrodes are arranged in parallel along one side of the semiconductor chip 101. The source electrode 101b is connected to the negative electrode side terminal 102B via a bonding wire 110a. The positive electrode side terminal 102A is connected to the drain electrode 101a via a bonding wire 110b and the drain fin 103.

The gate electrode 101c is connected to the switching terminal 102C via a bonding wire 110c. The switching terminal 102C is provided to switch whether to flow a current in a current path between the drain electrode 101a and the source electrode 101b.

The unimproved device 100 has a configuration, in which, except for a tip portion of each terminal and part of the drain fin 103, main part of the unimproved device 100 is embedded in insulating synthetic resin 105 such as epoxy resin by molding.

Figure 2:
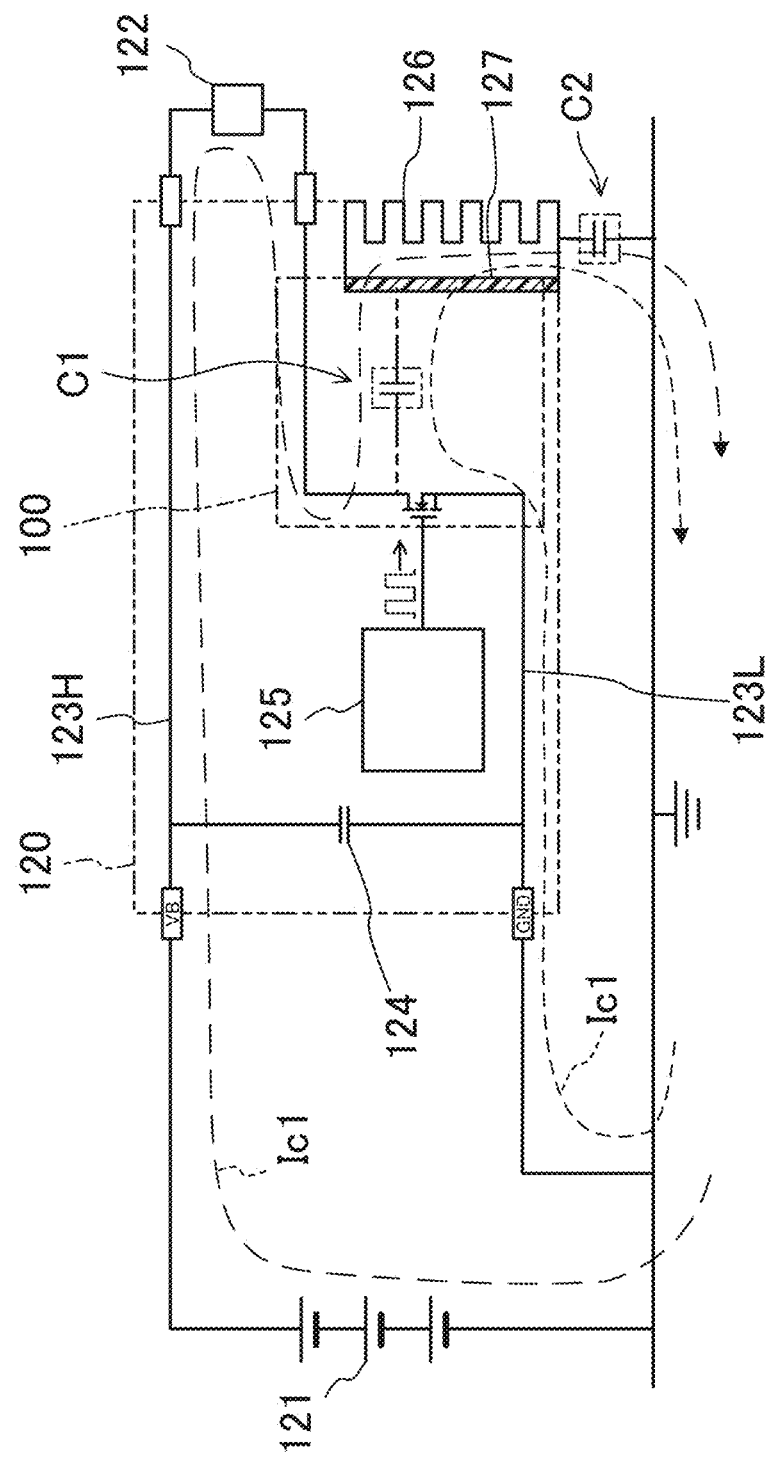
FIG. 2 is a schematic circuit diagram of an ECU equipped with the unimproved device.

FIG. 2 shows a schematic circuit diagram of an electronic control unit (ECU, unimproved ECU 120) equipped with the unimproved device 100, as an example. The unimproved ECU 120 is connected to a predetermined DC power source 121 and a predetermined load 122. The load 122 is, for example, a DC motor.

The unimproved ECU 120 has a pair of junction lines (positive electrode side line 123H and negative electrode side line 123L) connecting the positive and negative electrodes of the DC power source 121 to the load 122. The unimproved ECU 120 also has a smoothing capacitor 124 on the input side of these junction lines 123H, 123L.

The positive electrode side terminal 102A (drain electrode 101a) of the unimproved device 100 is connected to a line to which the low potential side of the load 122 is connected. The negative electrode side terminal 102B (source electrode 101b) of the unimproved device 100 is connected to the negative electrode side line 123L.

The unimproved ECU 120 includes a control circuit 125 that performs the switching control. The control circuit 125 is connected to the switching terminal 102C of the unimproved device 100. The unimproved ECU 120 turns on and off the unimproved device 100 at a predetermined drive frequency (e.g., 100 kHz) to intermittently supply power from the DC power source 121 to the load 122.

The unimproved ECU 120 includes a heat sink 126 made of aluminum. The drain fin 103 is bonded to the heat sink 126 via an insulator 127 such as a substrate or an insulating sheet.

Stray Capacitance, Common Mode Current

A structure capable of accumulating electric charge, i.e., a structure in which two electrical conductors face each other via an insulating material (dielectric), is provided between the drain fin 103 and the heat sink 126. This structure allows a certain stray capacitance to be generated at this portion (for the sake of easy explanation, it is assumed that a virtual capacitor C is formed at the portion where the stray capacitance is generable).

That is, a first virtual capacitor C1 is formed between the drain fin 103 and the heat sink 126. In addition, a second virtual capacitor C2 would be present between the heat sink 126 and the ground. In a case where the unimproved ECU 120 is mounted on a vehicle, the heat sink 126 would be connected to a metallic portion of a vehicle body in some cases. A ground terminal of the unimproved ECU 120 is grounded or connected to the negative electrode side of the DC power source 121. The negative electrode side of the DC power source 121 is grounded or is in a floating state.

When the unimproved ECU 120 operates, a rectangular-waved voltage including a harmonic component is intermittently applied to the positive electrode side terminal 102A of the unimproved device 100 by the switching control. Accordingly, common mode current flows via the first virtual capacitor C1 and the second virtual capacitor C2, as indicated by the dashed arrow Ic1 in FIG. 2. In a case where the heat sink 126 and the negative electrode side of the DC power source 121 are grounded, common mode current flows via the first virtual capacitor C1. If the negative electrode side of the DC power source 121 is in the floating state, common mode current flows via the virtual capacitor C occurred correspondingly to the floating state.

The common mode current includes a harmonic component and flows in a path having a great current loop area. Thus, when the common mode current flows, great electromagnetic field noise is emitted. As a result, troubles such as malfunction of an electronic control system located nearby and communication disturbance would occur.

Improved Device

Figure 3:
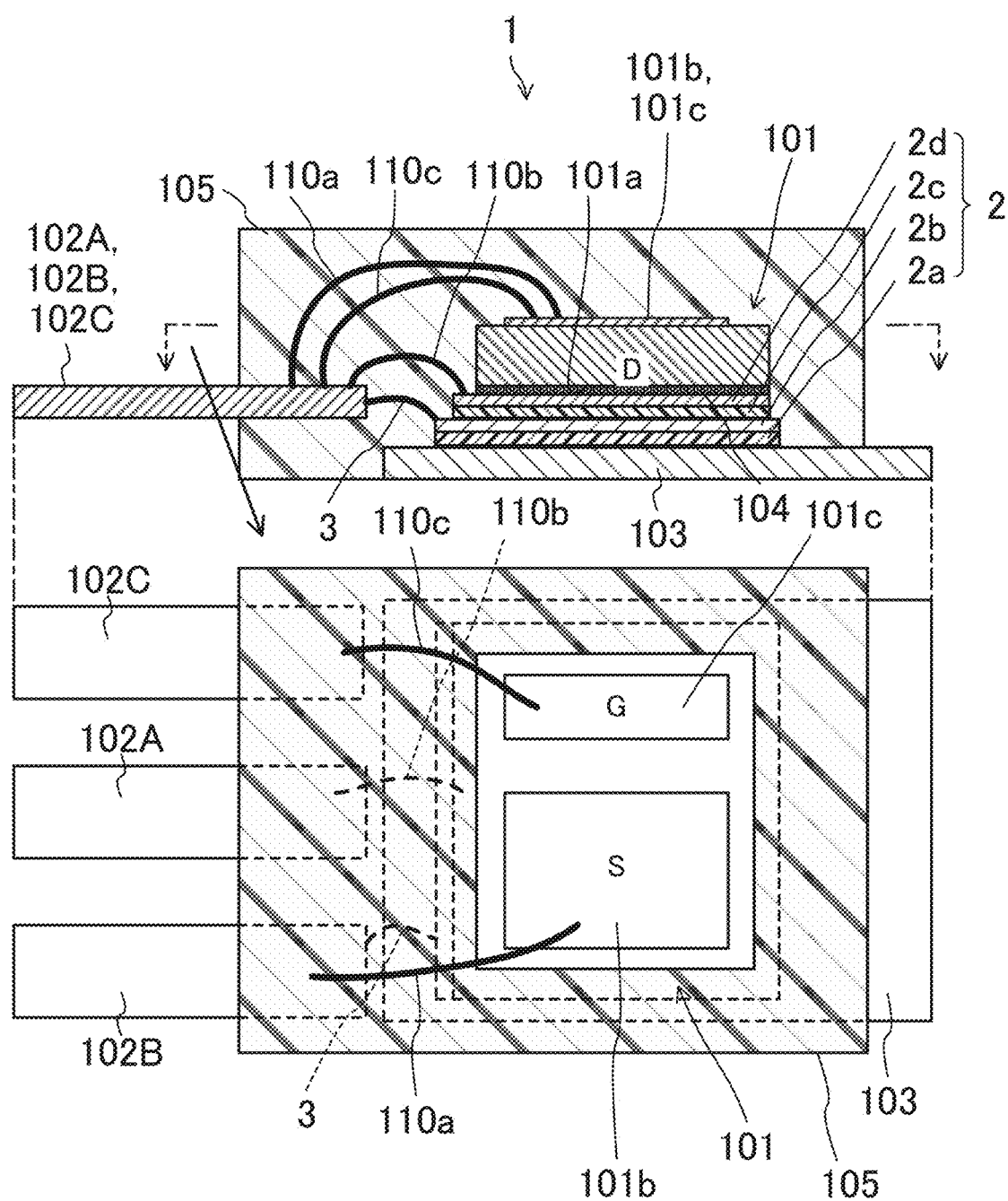
FIG. 3 is a schematic view showing an improved device (example) to which the technique disclosed herein is applied.

FIG. 3 shows a switching device (improved device 1) to which the technique disclosed herein is applied. A basic structure of the improved device 1 is the same as that of the unimproved device 100. Thus, the like reference numerals are used to represent components having the like configurations, and the description thereof will be simplified or omitted (the same applies hereinafter).

The improved device 1 includes the semiconductor chip 101, the plurality of terminals (positive electrode side terminal 102A, negative electrode side terminal 102B, switching terminal 102C) formed of the copper lead frame, and the drain fin 103.

The improved device 1 is different from the unimproved device 100 in that a common mode current suppression structure 2 with a certain configuration is interposed between the semiconductor chip 101 and the drain fin 103.

The common mode current suppression structure 2 includes a first insulating layer 2a, an electric conductive layer 2b, a second insulating layer 2c, and an electrode conductor 2d. The first insulating layer 2a is made of a ceramic sintered material. The first insulating layer 2a is joined on the drain fin 103. The electric conductive layer 2b is joined on the first insulating layer 2a. The electric conductive layer 2b is formed in such a manner that silver paste is printed on the first insulating layer 2a.

The silver paste is one example of a material having fluidity. Materials having fluidity are printable, and the electric conductive layer 2b can be formed at low cost with such a printable material. The electric conductive layer 2b may be a metallic thin film formed by a method such as sputtering. In this case, the electric conductive layer 2b, which is thin and excellent in thermal conductivity, can be formed.

The second insulating layer 2c is also made of a ceramic sintered material. The second insulating layer 2c is joined on the electric conductive layer 2b. The electrode conductor 2d is a copper plate, and is joined on the second insulating layer 2c. The upper surface of the electrode conductor 2d is soldered to the lower surface of the drain electrode 101a.

The common mode current suppression structure 2 may include a printed circuit board. That is, the first insulating layer 2a, the electric conductive layer 2b, and the second insulating layer 2c are stacked to form a plate-shape. After that, the electrode conductor 2d having a predetermined pattern corresponding to wiring is printed thereon. In this manner, the improved device 1 can be produced at low cost.

As the materials of the first insulating layer 2a and the second insulating layer 2c, silicone resin may be used. In this case, the electric conductive layer 2b may be formed in the shape of a plate having rigidity, such as a copper plate, and silicone resin may be applied onto both surfaces thereof. In this manner, even if silicon resin has elasticity, a bonding wire can be stably connected.

The semiconductor chip 101 is not limited to a power MOSFET. The semiconductor chip 101 may be, e.g., a bipolar transistor or an IGBT.

The gate electrode 101c is connected to the switching terminal 102C via the bonding wire 110c. The source electrode 101b is connected to the negative electrode side terminal 102B via the bonding wire 110a. The positive electrode side terminal 102A is connected to the drain electrode 101a via the bonding wire 110b and the electrode conductor 2d.

The negative electrode side terminal 102B is connected to the electric conductive layer 2b via a bonding wire 3. Thus, the electric conductive layer 2b is electrically connected to the source electrode 101b.

The improved device 1 has an integrated configuration, in which, except for the tip portion of each terminal and part of the drain fin 103, main part of the improved device 1 is embedded in the insulating synthetic resin 105. The tip portion of each terminal and part of the drain fin 103 exposed from the synthetic resin 105 are soldered to a printed wiring board (not illustrated), which is a well-known one.

In this way, the improved device 1 is mounted on the printed wiring board. The drain fin 103 may be screwed to the heat sink 126 with the insulator 127 therebetween.

Common Mode Current Suppression Structure 2

Figure 4:
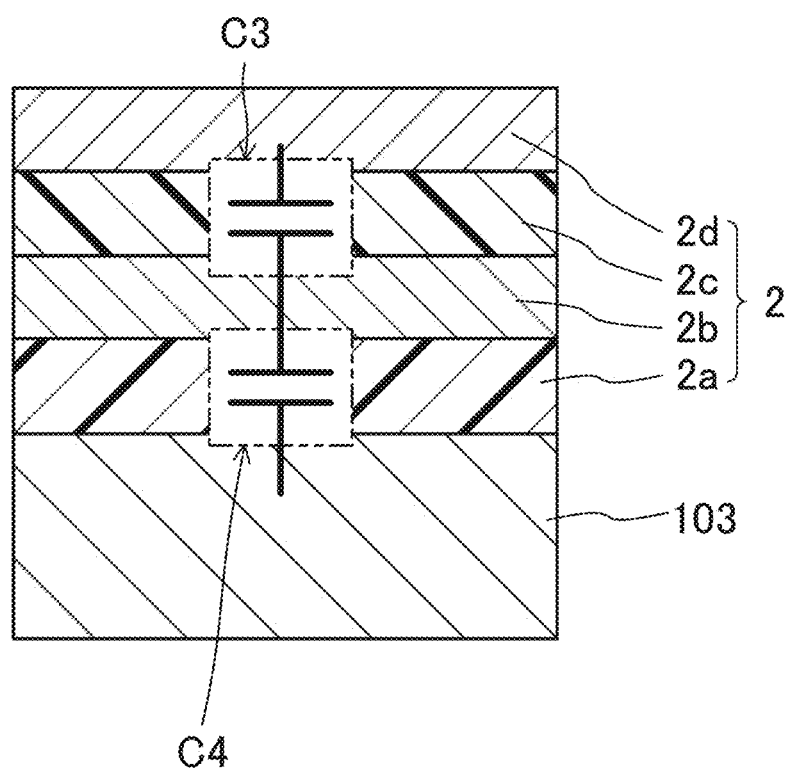
FIG. 4 is a schematic view showing a cross section of a common mode current suppression structure.

FIG. 4 schematically shows the cross section of the common mode current suppression structure 2. In the common mode current suppression structure 2, a structure capable of accumulating charge is formed both between the electrode conductor 2d and the electric conductive layer 2b and between the electric conductive layer 2b and the drain fin 103.

Accordingly, a virtual capacitor C (third virtual capacitor C3) is formed between the electrode conductor 2d and the electric conductive layer 2b. A virtual capacitor C (fourth virtual capacitor C4) is formed between the electric conductive layer 2b and the drain fin 103. In a case where the semiconductor chip 101 has a general-purpose size, the absolute value of a stray capacitance generated in each of the virtual capacitors C3, C4 is about several hundreds to 1000 pF.

Figure 5:
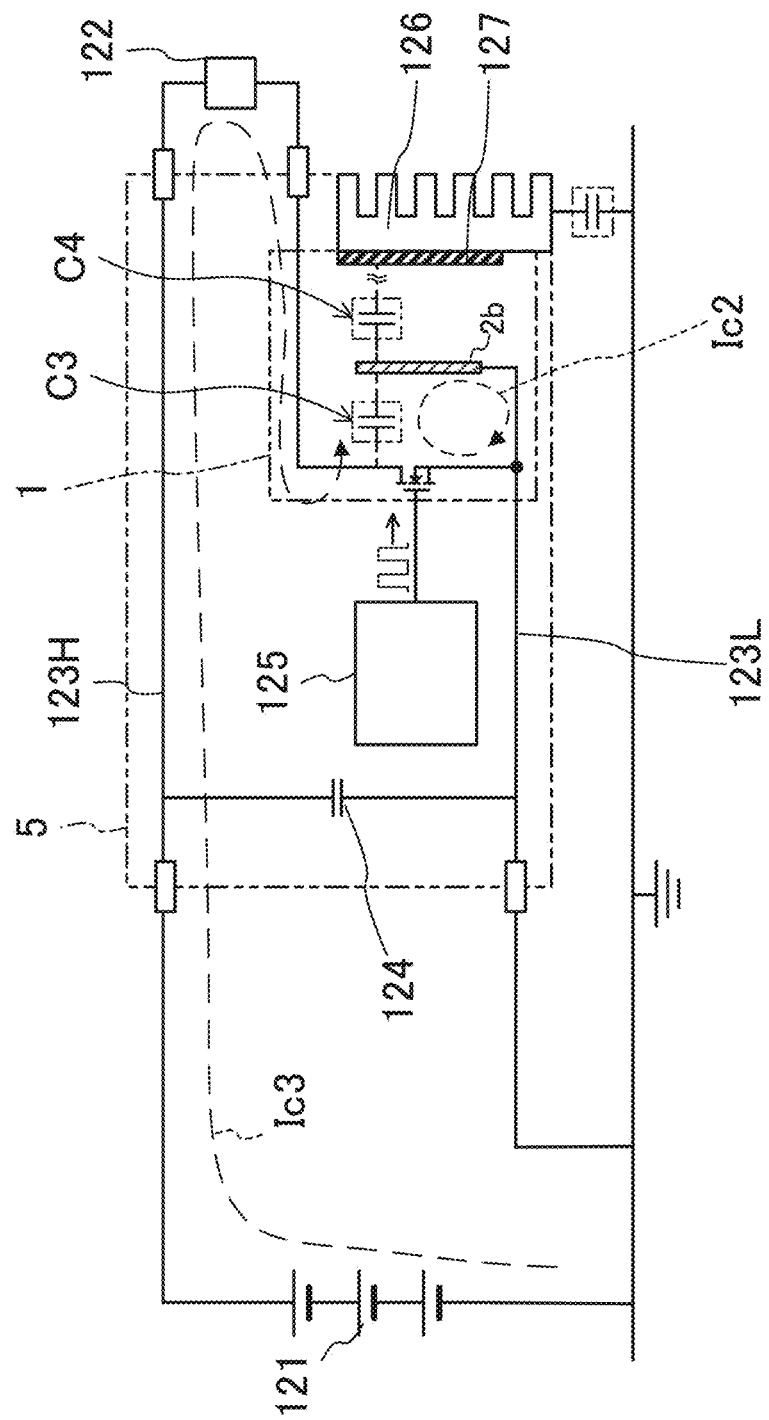
FIG. 5 is a schematic circuit diagram of an ECU equipped with the improved device.

FIG. 5 shows an example of an ECU (improved ECU 5) equipped with the improved device 1. A basic structure of the improved ECU 5 is the same as that of the unimproved ECU 120 shown in FIG. 2.

When the improved ECU 5 operates, a rectangular-waved voltage including a harmonic component is intermittently applied to the positive electrode side terminal 102A of the improved device 1 by the switching control. In a case where the improved device 1 is turned on, the stray capacitance in the third virtual capacitor C3 formed between the electrode conductor 2d and the electric conductive layer 2b is discharged via a loop-shaped current path indicated by the dashed arrow Ic2.

In a case where the improved device 1 is turned off, the third virtual capacitor C3 is charged with voltage supplied thereto from the DC power source 121 via the load 122, as indicated by the dashed arrow Ic3. The electric conductive layer 2b is held at the ground potential regardless of whether the improved device 1 is turned on or off.

Thus, there is no potential difference between the electric conductive layer 2b and the drain fin 103 regardless of whether the improved device 1 is turned on or off. Since no charge is accumulated in the fourth virtual capacitor C4, no current flows via the third virtual capacitor C3 and the fourth virtual capacitor C4. That is, the current value is zero. Accordingly, no common mode current flows. Thus, occurrence of common mode noise can be prevented.

Switching Module

Unimproved Module

For the sake of easy understanding of the technique disclosed herein, a switching module (unimproved module 130) before application of the technique disclosed will be described as a comparative example.

Figure 6:
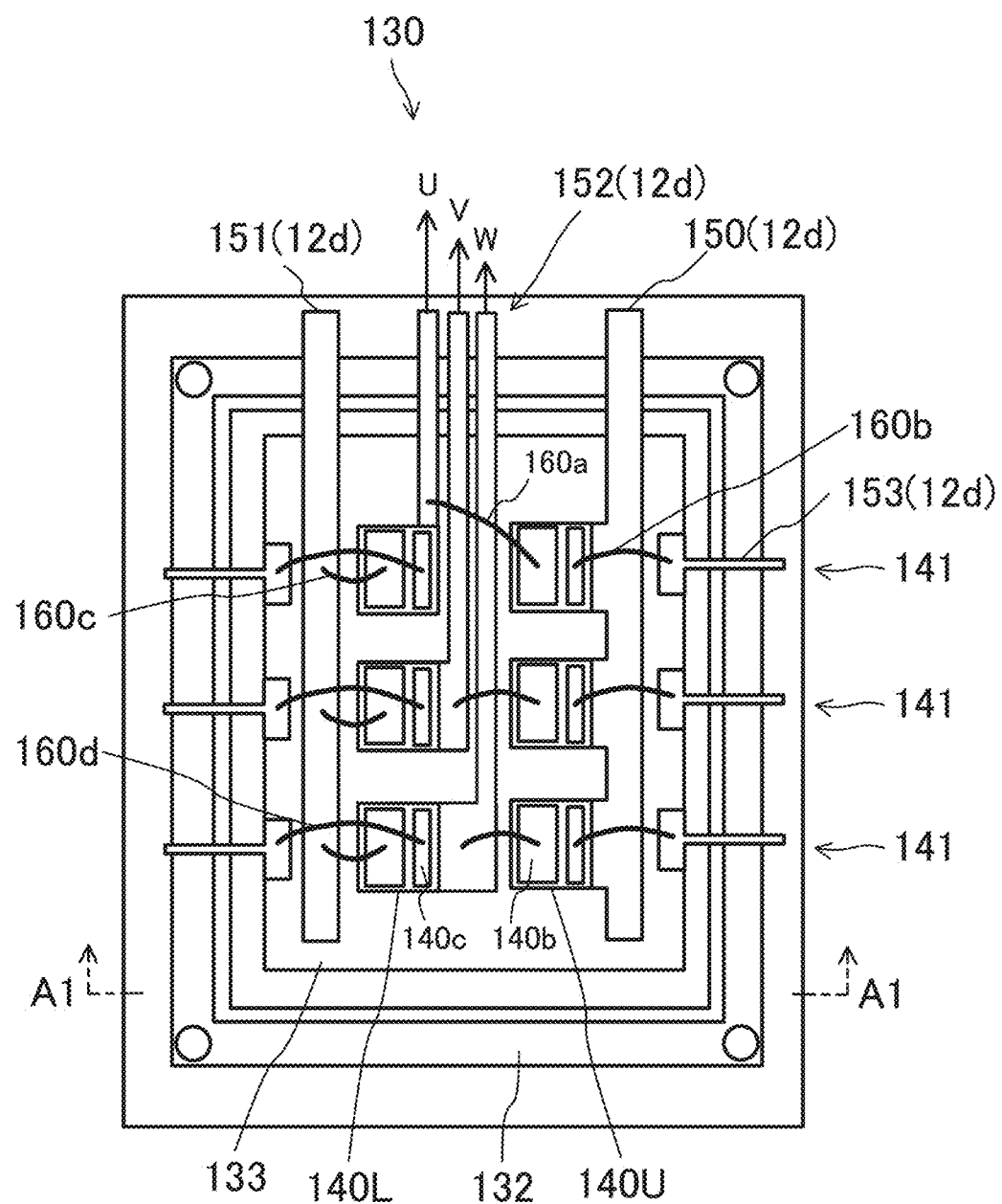
FIG. 6 is a schematic view (view from above) showing an unimproved module (comparative example).
Figure 7:
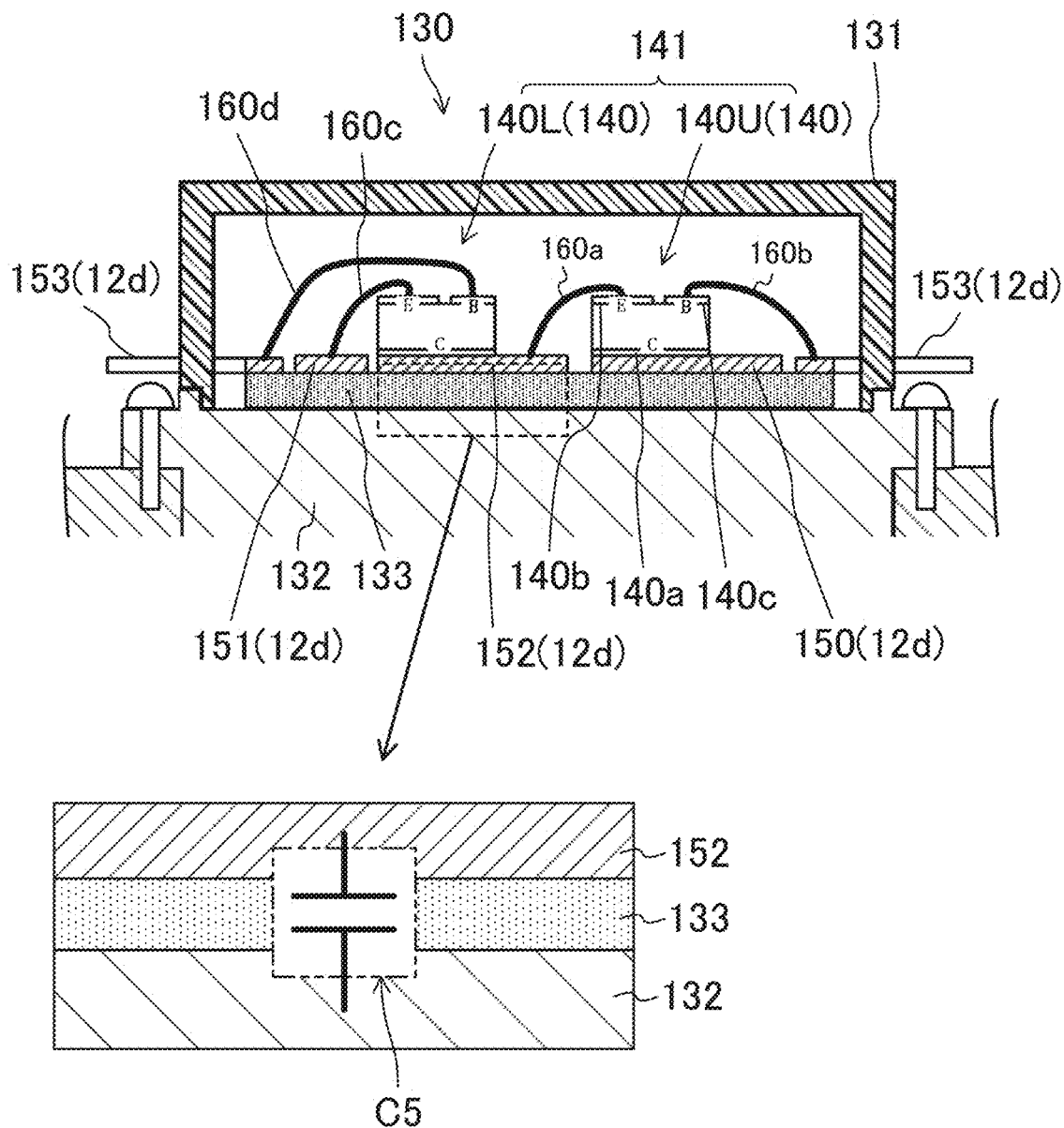
FIG. 7 is a schematic cross-sectional view taken along the arrow A1-A1 of FIG. 6.

FIGS. 6 and 7 show the unimproved module 130. FIG. 6 is a schematic view illustrating the inside of the unimproved module 130 viewed from above. FIG. 7 is a schematic cross-sectional view taken along the arrow A1-A1 of FIG. 6.

The unimproved module 130 includes a plurality of later-described electronic components, a case cover 131, and a heat sink 132. The unimproved module 130 includes three half-bridge circuits 141, each of which includes two switching elements 140 (semiconductor chip, upper arm chip 140U and a lower arm chip 140L) connected in series. As will be described later, the half-bridge circuits 141 are bridged in parallel between a positive electrode side line 142H and a negative electrode side line 142L to form an inverter circuit.

Here, the switching elements 140 are an IGBT. A character "C" in the figure indicates a collector electrode 140a (first terminal portion), and a character "E" indicates an emitter electrode 140b (second terminal portion). A character "B" indicates a base electrode 140c (third terminal portion). Although a free wheel diode is connected in anti-parallel with each switching element 140 (see FIG. 8), illustration thereof is omitted.

The unimproved module 130 includes an insulating substrate 133 and the heat sink 132 joined to the lower surface of the substrate 133. On the upper surface of the substrate 133, an electrode conductor 12d having a predetermined pattern corresponding to electrical wiring is formed. Using the electrode conductor 12d, an electronic circuit including the inverter circuit is provided.

More specifically, as shown in FIG. 6, the electrode conductor 12d includes a positive electrode side line terminal portion 150 constituting the positive electrode side line 142H (see FIG. 8), a negative electrode side line terminal portion 151 constituting the negative electrode side line 142L, three output line terminal portions 152 constituting output lines 142S respectively corresponding to U, V, and W phases, and six switching terminal portions 153 constituting the switching terminals 102C connected to the base electrodes 140c of the semiconductor chips 101.

The emitter electrode 140b and the base electrode 140c are provided on the upper surface of the semiconductor chip 101. The emitter electrode 140b is greater in area than the base electrode 140c used for control. Each upper arm chip 140U is soldered to a predetermined location on the positive electrode side line terminal portion 150. Accordingly, the collector electrode 140a of the upper arm chip 140U is connected to the positive electrode side line 142H.

The emitter electrode 140b of each upper arm chip 140U is connected to the output line terminal portion 152 of the same phase via a bonding wire 160a. Accordingly, the emitter electrode 140b of each upper arm chip 140U is connected to the output line 142S. The base electrode 140c of each upper arm chip 140U is connected to the switching terminal portion 153 via a bonding wire 160b.

Each lower arm chip 140L is soldered to a predetermined location on the output line terminal portion 152 of each phase. Accordingly, the collector electrode 140a of each lower arm chip 140L is connected to the output line 142S of each phase.

The emitter electrode 140b of each lower arm chip 140L is connected to the negative electrode side line terminal portion 151 via a bonding wire 160c. The base electrode 140c of each lower arm chip 140L is connected to the switching terminal portion 153 via a bonding wire 160d. Each switching terminal portion 153 is provided to switch whether to flow a current in a current path between the collector electrode 140a and the emitter electrode 140b.

A structure capable of accumulating charge is formed between the output line terminal portion 152 of each phase (in particular, that portion of the lower arm chip 140L in which the collector electrode 140a is located) and the heat sink 132. The voltage of the output line terminal portion 152 is intermittently changed by the switching control.

Accordingly, as shown in FIG. 7 in close-up, a virtual capacitor C (fifth virtual capacitor C5) where a certain stray capacitance would be generated is formed at this portion.

Figure 8:
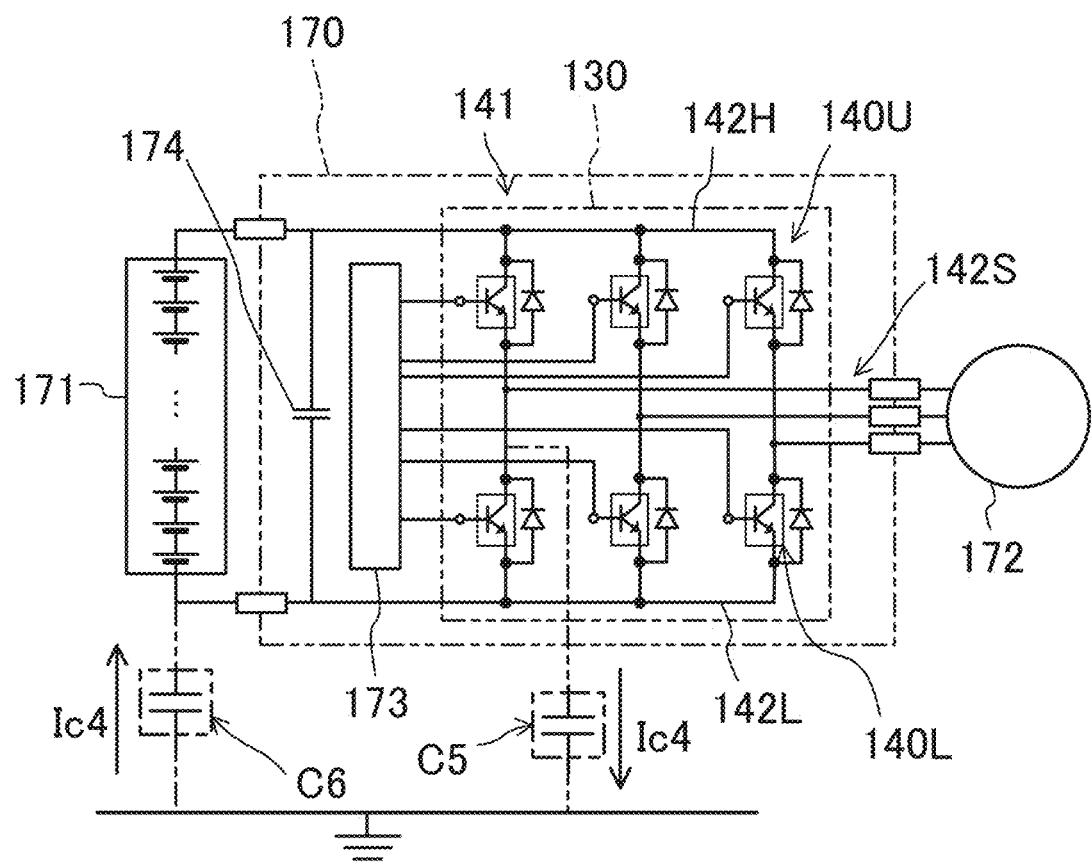
FIG. 8 is a circuit diagram of an inverter equipped with the unimproved module.

FIG. 8 shows an example of an in-vehicle inverter (unimproved inverter 170) equipped with the unimproved module 130. The unimproved inverter 170 is installed between a high-voltage battery 171 for motor-driving and a drive motor 172 for vehicle-driving. The unimproved inverter 170 includes a control circuit 173 that performs the switching control. The unimproved inverter 170 also includes a smoothing capacitor 174.

The control circuit 173 is connected to the base electrode 140c of each switching element 140 of the unimproved module 130. The unimproved inverter 170 turns on and off the switching elements 140 at a predetermined drive frequency (for example, 10 kHz), converts DC power supplied from the high-voltage battery 171 into three-phase AC power of U, V, and W phases, and supplies the AC power to the drive motor 172.

The heat sink 132 is grounded by being connected to the metallic portion of the vehicle body. Accordingly, the fifth virtual capacitor C5 is formed between the output line terminal portion 152 (collector electrode 140a) of the lower arm chip 140L of each phase and the heat sink 132, as described above. Since the high-voltage battery 171 is in a floating state, a virtual capacitor C (sixth virtual capacitor C6) having a certain stray capacitance is present between the high-voltage battery 171 and the ground.

When the unimproved inverter 170 operates, a rectangular-waved high voltage including a harmonic component is applied (to a midpoint) between the upper arm chip 140U and the lower arm chip 140L in each half-bridge circuit 141. Accordingly, common mode current flows via a current path passing through the fifth virtual capacitor C5 and the sixth virtual capacitor C6, as indicated by the arrow Ic4 in FIG. 8. As a result, common mode noise occurs.

The rated voltage of the high-voltage battery 171 is, for example, a high voltage of 40 V or more or 100 V or more. Thus, in this case, a voltage change caused is great, and consequently the common mode current and common mode noise are also great.

Improved Module

Figure 9:
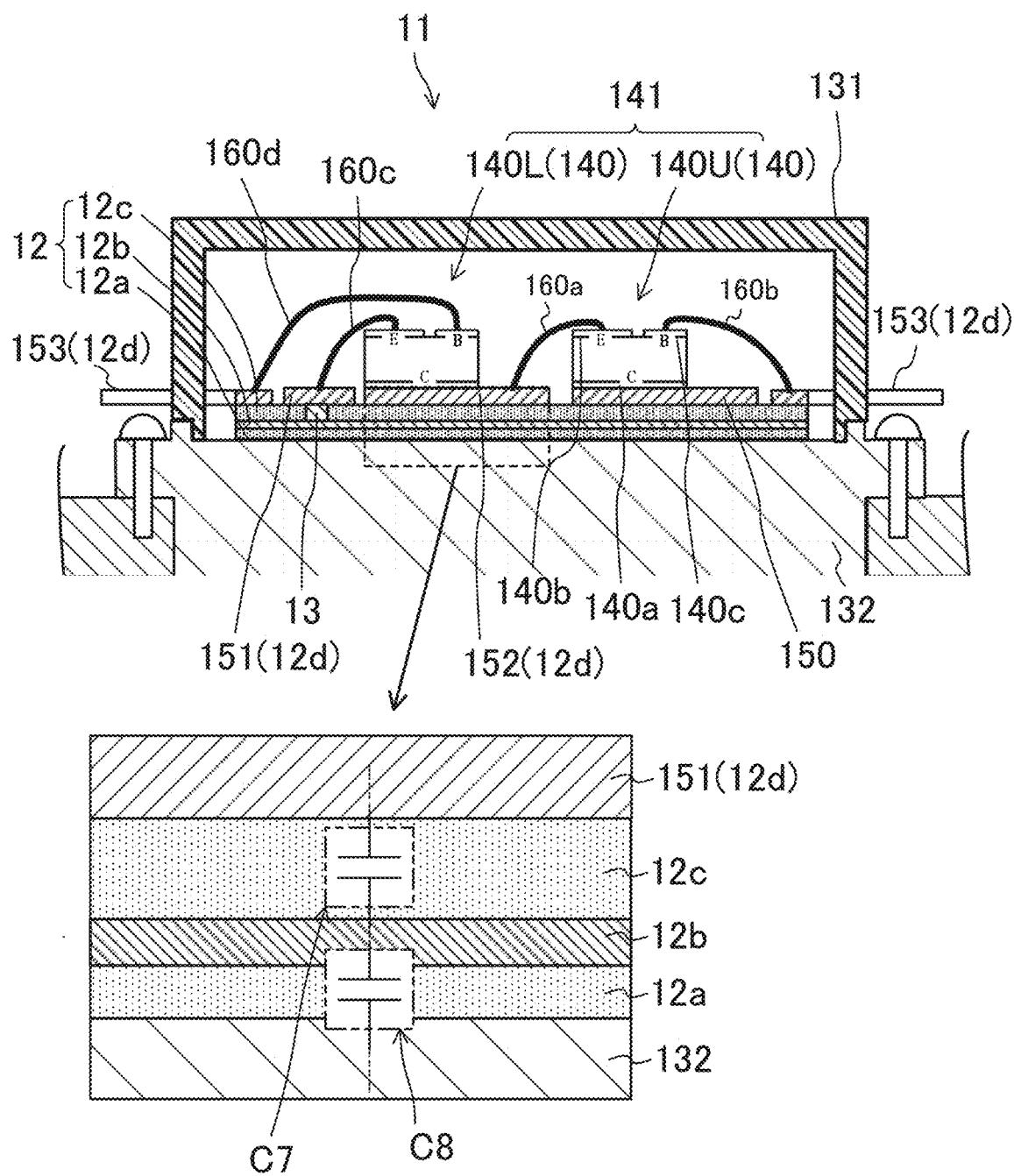
FIG. 9 is a schematic view showing an improved module (example).

FIG. 9 shows a switching module (improved module 11) to which the technique disclosed herein is applied. FIG. 9 is a view corresponding to FIG. 7. Since the top view of the improved module 11 is the same as FIG. 6, illustration thereof is omitted. A basic structure of the improved module 11 is the same as that of the unimproved module 130.

The improved module 11 is different from the unimproved module 130 in that a common mode current suppression structure 12 according to the present disclosure is interposed between each switching element 140 and the heat sink 132.

The common mode current suppression structure 12 has a first insulating layer 12a, an electric conductive layer 12b, a second insulating layer 12c, and the above-described electrode conductor 12d. The first insulating layer 12a is made of a ceramic sintered material. The first insulating layer 12a is joined on the heat sink 132. The electric conductive layer 12b is joined on the first insulating layer 12a. The electric conductive layer 12b is formed in such a manner that silver paste is printed on the first insulating layer 12a.

The second insulating layer 12c is also made of a ceramic sintered material. The second insulating layer 12c is joined on the electric conductive layer 12b. The electrode conductor 12d is a copper plate, and is joined on the second insulating layer 12c. The upper surface of the electrode conductor 12d is soldered to the lower surface of the collector electrode 140a of each switching element 140.

Main part of the switching element 140 and the common mode current suppression structure 12 of the improved module 11 etc. are the same as the main part of the semiconductor chip 101 and the common mode current suppression structure 2 of the above-described improved device 1. Thus, these common components are mutually applicable.

For example, the common mode current suppression structure 12 of the improved module 11 can be formed in a manner similar to that for the common mode current suppression structure 2 of the above-described improved device 1. That is, the electric conductive layer 12b may be a metallic thin film, and the common mode current suppression structure 12 may include a printed circuit board. As the materials of the first insulating layer 12a and the second insulating layer 12c, silicone resin may be used.

A through-hole 13 penetrating both surfaces of the second insulating layer 12c is provided at a predetermined location in the second insulating layer 12c. More specifically, the through-hole 13 is provided at a location below the negative electrode side line terminal portion 151 of each phase. Thus, the electric conductive layer 12b is electrically connected to the negative electrode side line terminal portion 151 (and the emitter electrode 140b of each lower arm chip 140L) via the through-hole 13.

In the improved module 11, the negative electrode side line terminal portion 151 (and the emitter electrode 140b of the lower arm chip 140L) corresponds to a "constant potential portion."

Accordingly, as shown in FIG. 9 in close-up, a virtual capacitor C (seventh virtual capacitor C7 and eighth virtual capacitor C8) where a certain stray capacitance would be generated is formed on the lower side of the negative electrode side line terminal portion 151 of each phase.

More specifically, the negative electrode side line terminal portion 151 of each phase and the electric conductive layer 12b face each other via the second insulating layer 12c, and accordingly, the seventh virtual capacitor C7 in which the certain stray capacitance would be generated is formed at this portion. Moreover, the electric conductive layer 12b and the heat sink 132 face each other via the first insulating layer 12a, and accordingly, the eighth virtual capacitor C8 in which the certain stray capacitance would be generated is formed at this portion.

Figure 10:
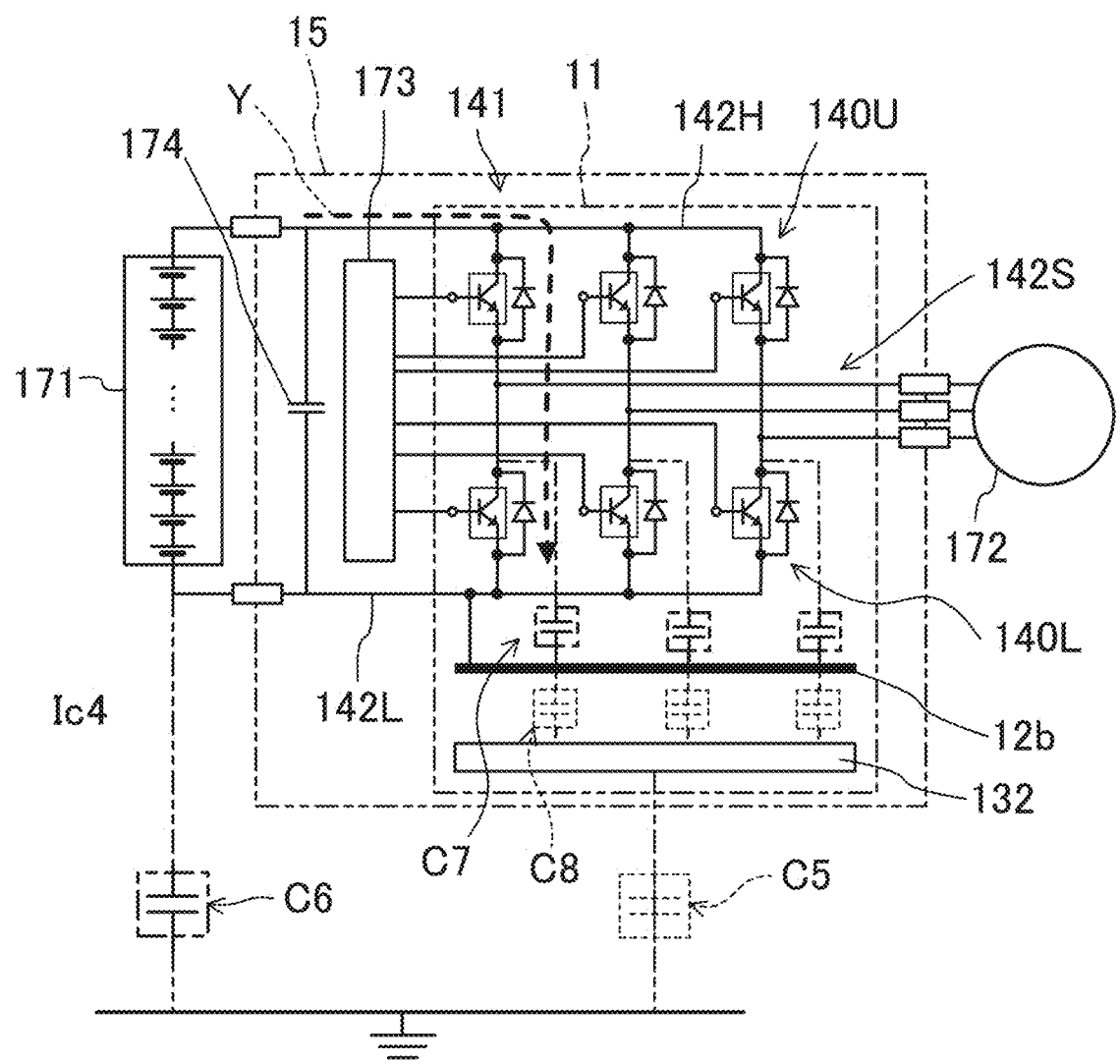
FIG. 10 is a circuit diagram of an inverter equipped with the improved module.

FIG. 10 shows an example of an in-vehicle inverter (improved inverter 15) equipped with the improved module 11. A basic structure of the improved inverter 15 is the same as that of the unimproved inverter 170 shown in FIG. 8.

When the improved inverter 15 operates, each switching element 140 forming the inverter circuit is turned on or off at a predetermined timing by the switching control. The contents of ON/OFF of the switching elements 140 are periodically switched in the half-bridge circuit 141 of each phase. Thus, the same basic operation is applied to all phases. Here, the lower arm chip 140L of the half-bridge circuit 141 of the U phase will be described as an example.

While the lower arm chip 140L of the U phase is turned off, the upper arm chip 140U of the U phase is turned on. Accordingly, as indicated by the dashed arrow Y, the seventh virtual capacitor C7 for the U phase is supplied and charged with the voltage of the high-voltage battery 171. At this time, the electric conductive layer 12b forming the seventh virtual capacitor C7 is electrically connected to the negative electrode side of the high-voltage battery 171. Thus, the electric conductive layer 12b is at the same potential as that of the negative electrode side of the high-voltage battery 171.

While the lower arm chip 140L of the U phase is turned on, the upper arm chip 140U of the U phase is turned off. Accordingly, the charge accumulated in the seventh virtual capacitor C7 of the U phase is discharged through a current path passing through the electric conductive layer 12b. Also, at this time, the electric conductive layer 12b is at the same potential as that of the negative electrode side of the high-voltage battery 171.

The electric conductive layer 12b is held at the potential of the negative electrode side of the high-voltage battery 171 regardless of whether the improved device 11 is turned on or off. That is, since the electric conductive layer 12b is electrically connected to a portion (constant potential portion) where a constant potential is held, the potential does not change even when the switching control is performed.

Thus, there is no potential difference between the electric conductive layer 12b and the heat sink 132 regardless of whether the improved device 11 is turned on or off. Since no charge is accumulated in the eighth virtual capacitor C8, no current flows in a current path passing through the seventh virtual capacitor C7 and the eighth virtual capacitor C8. The current value is zero.

According to the improved module 11, no common mode current flows even when the switching control is performed. Thus, occurrence of common mode noise can be prevented.

Variations of Improved Module 11

Figure 11:
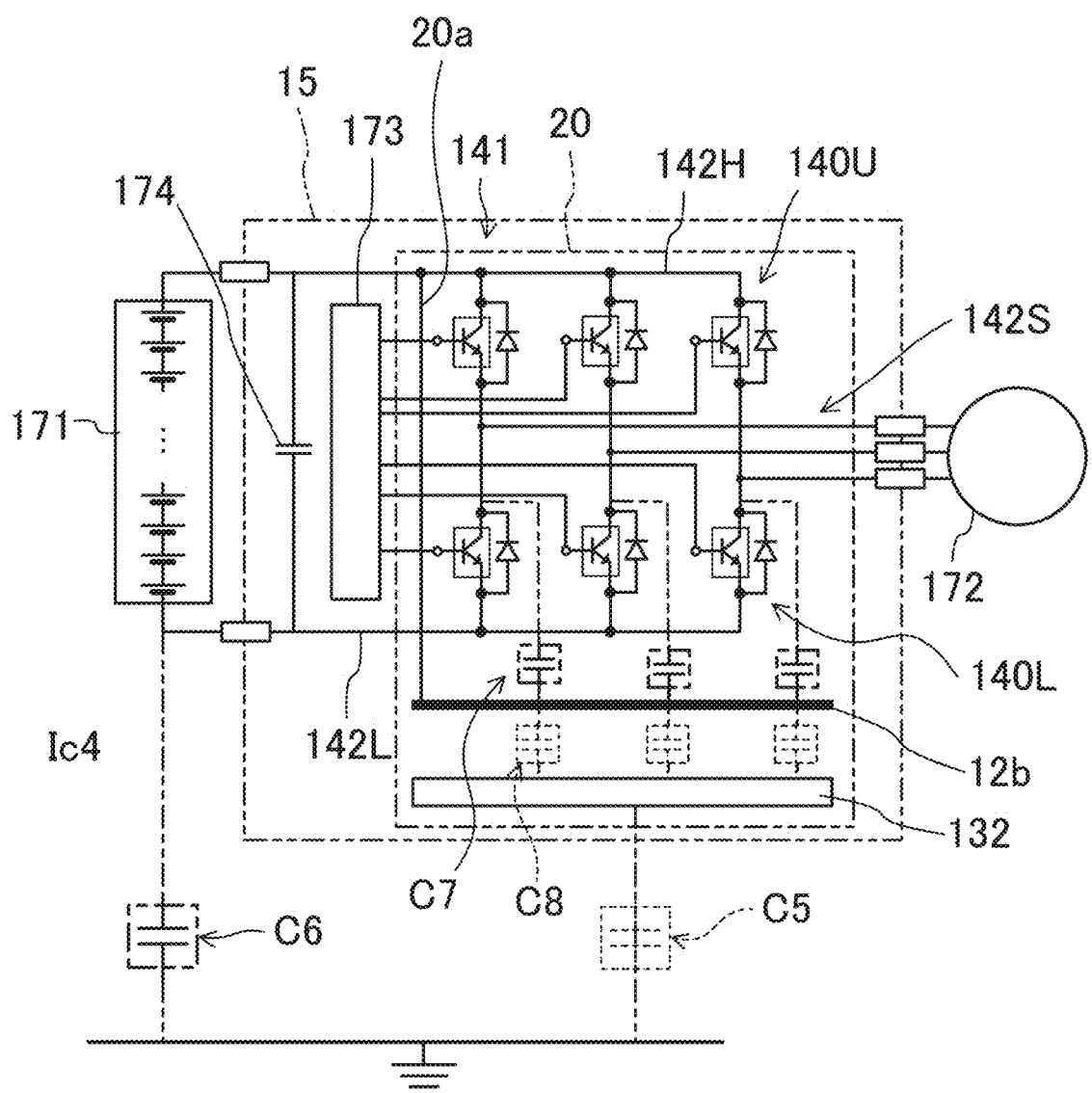
FIG. 11 is a diagram for describing a variation (second improved module) of the improved module.

FIG. 11 shows a variation (second improved module 20) of the improved module 11.

In the above-described improved module 11, the portion of the negative electrode side line 142L, more specifically the negative electrode side line terminal portion 151 (the emitter electrode 140b of each lower arm chip 140L), is the "constant potential portion." However, it is sufficient that the electric conductive layer 12b is connected to a portion where the potential does not substantially change even when the switching control is performed. Thus, a portion other than the portion of the negative electrode side line 142L may be configured as the constant potential portion.

Thus, in the second improved module 20, the electric conductive layer 12b is connected not to the negative electrode side line terminal portion 151, but to the positive electrode side line terminal portion 150 (the collector electrode 140a of each upper arm chip 140U) which is a portion of the positive electrode side line 142H (see a second connection line in FIG. 11).

In this case, the electric conductive layer 12b is held at the potential of the positive electrode side of the high-voltage battery 171 regardless of whether the second improved module 20 is turned on or off. Thus, the potential does not change even when the switching control is performed.

Thus, there is no potential difference between the electric conductive layer 12b and the heat sink 132 regardless of whether the second improved module 20 is turned on or off. Since no charge is accumulated in the eighth virtual capacitor C8, no current flows in a current path passing through the seventh virtual capacitor C7 and the eighth virtual capacitor C8. The current value is zero.

According to the second improved module 20, no common mode current flows even when the switching control is performed. Thus, occurrence of common mode noise can be prevented.

Figure 12:
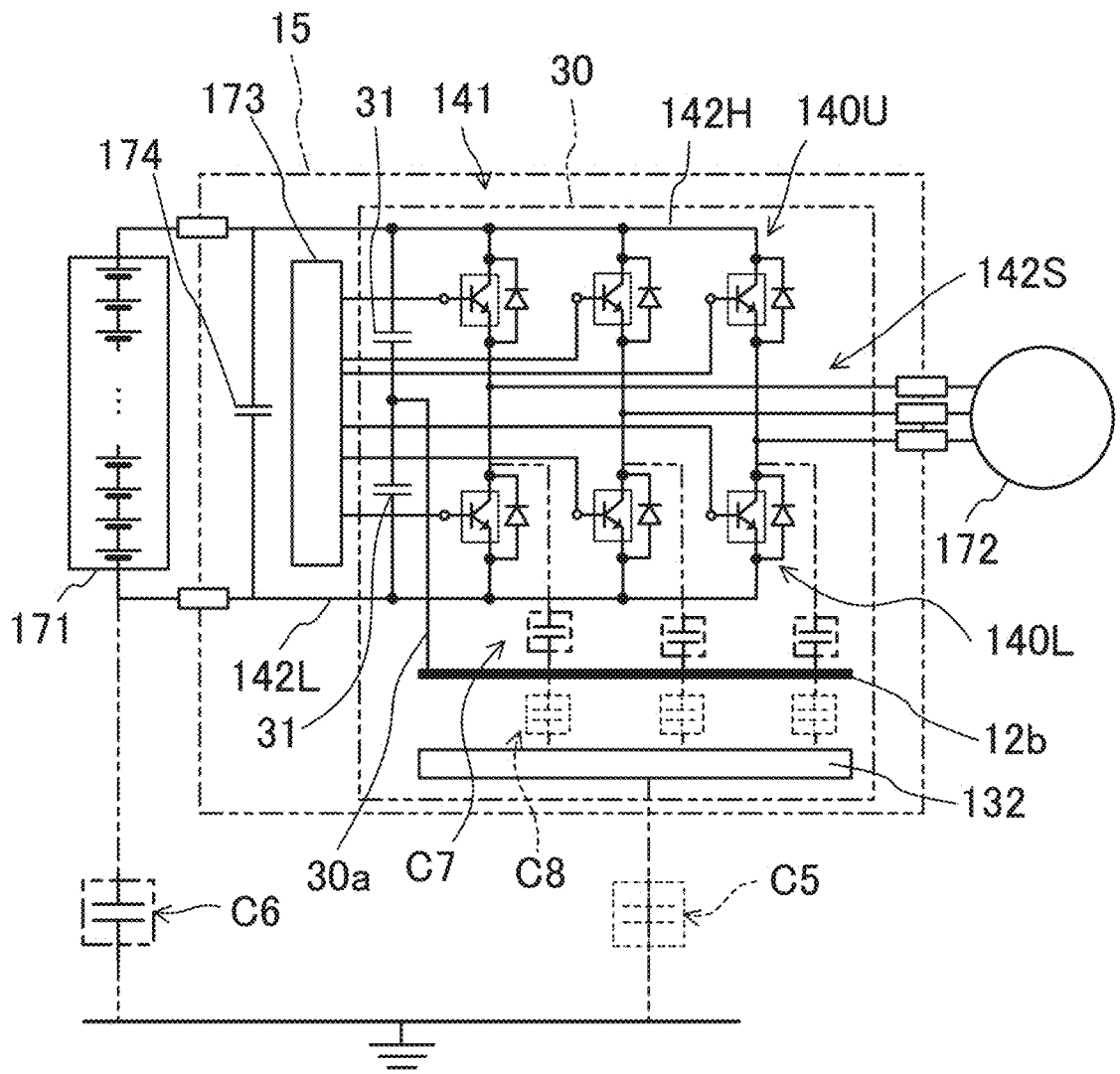
FIG. 12 is a diagram for describing a variation (third improved module) of the improved module.

FIG. 12 shows a variation (third improved module 30) of the improved module 11.

Unlike the above-described improved inverter 15, the improved inverter 15 equipped with the third improved module 30 includes, between the positive electrode side line 142H and the negative electrode side line 142L, two capacitors 31, 31 connected in series. A predetermined voltage value lower than the voltage of the high-voltage battery 171 is held at a portion between these two capacitors 31, 31.

Thus, in the third improved module 30, the electric conductive layer 12b is connected to the portion between the two capacitors 31, 31 (see a third connection line 30a in FIG. 12).

In this case, the electric conductive layer 12b is held at a potential lower than the voltage of the high-voltage battery 171 regardless of whether the third improved module 30 is turned on or off. Thus, the potential does not change even when the switching control is performed.

Thus, there is no potential difference between the electric conductive layer 12b and the heat sink 132 regardless of whether the third improved module 30 is turned on or off. Since no charge is accumulated in the eighth virtual capacitor C8, no current flows in a current path passing through the seventh virtual capacitor C7 and the eighth virtual capacitor C8. The current value is zero.

According to the third improved module 30, no common mode current flows even when the switching control is performed. Thus, occurrence of common mode noise can be prevented.

Results of Verification Test on Common Mode Current Suppression Structure

A test was conducted to verify the effect of the common mode current suppression structure. Results are shown in FIGS. 13 and 14.

Figure 13:
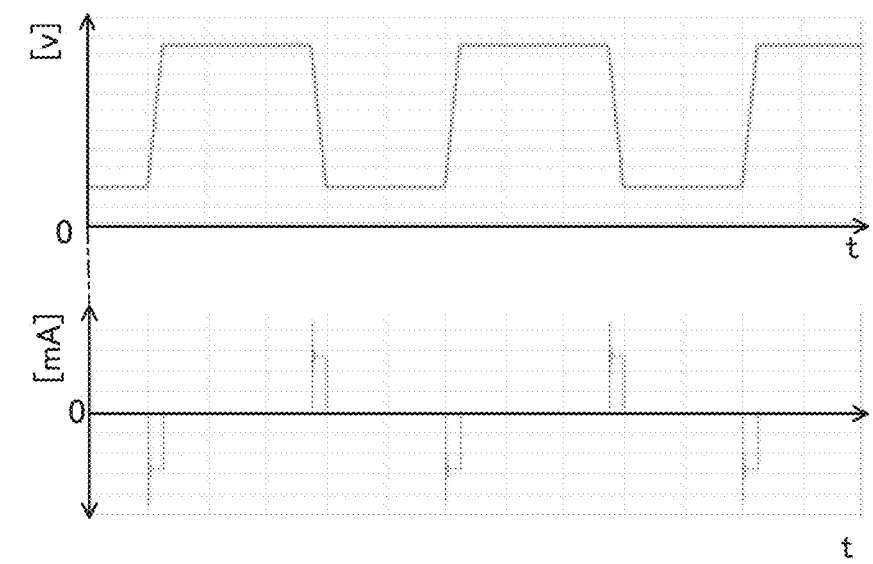
FIG. 13 is a graph for describing verification test results (unimproved module).
Figure 13:
Figure 13:
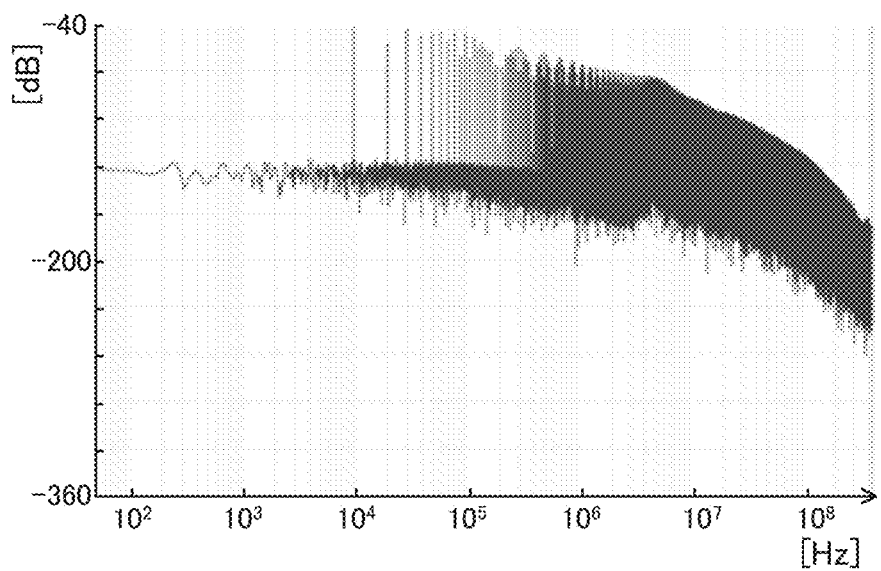
Figure 14:
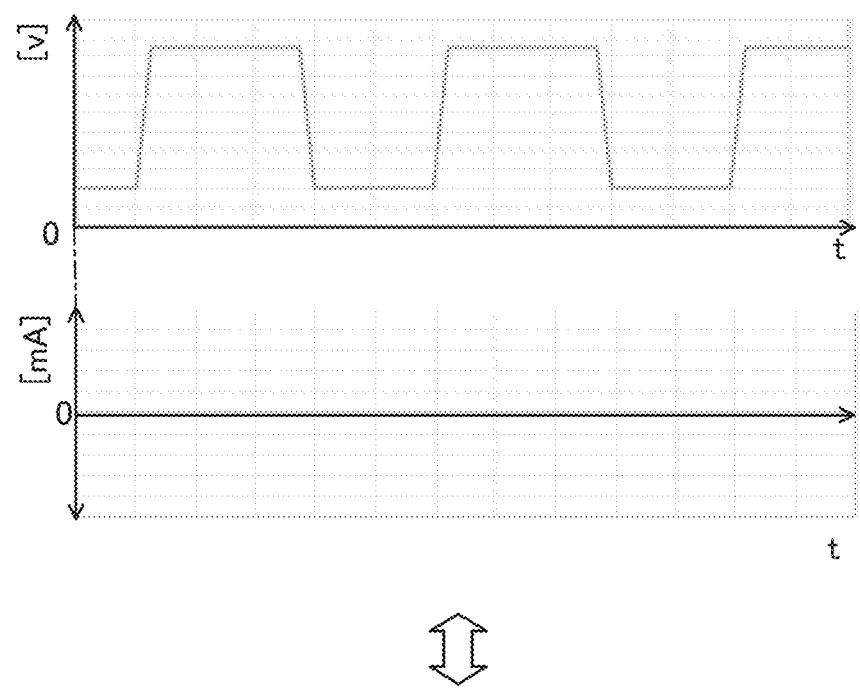
FIG. 14 is a graph for describing verification test results (third improved module).
Figure 14:
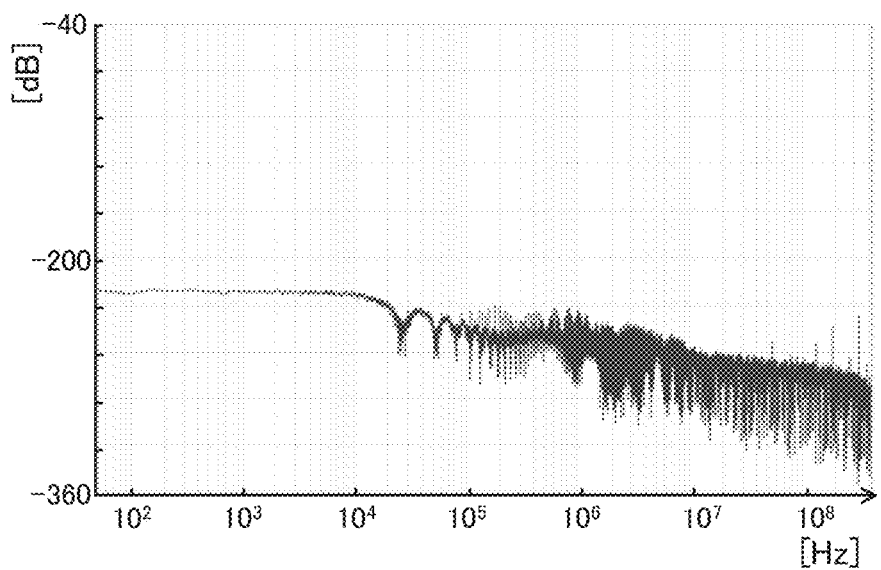

FIG. 13 shows the test results for the above-described unimproved inverter 170. FIG. 14 shows the test results for the improved inverter 15 equipped with the above-described third improved module 30.

The upper graph in each figure shows a voltage waveform output from a predetermined output line 142S and a corresponding common mode current waveform (actual measurement values). The lower graph in each figure is an observation graph of the frequency spectrum of the common mode current.

In the unimproved module 130, the common mode current periodically flows in response to a change in the voltage of the output line 142S, as shown in FIG. 13. High-frequency common mode noise reaching 100 MHz or more was observed in response to the common mode current.

On the other hand, in the third improved module 30, the common mode current and the common mode noise were reduced to unobservable levels, as shown in FIG. 14.

Second Embodiment of Improved Device

Figure 15:
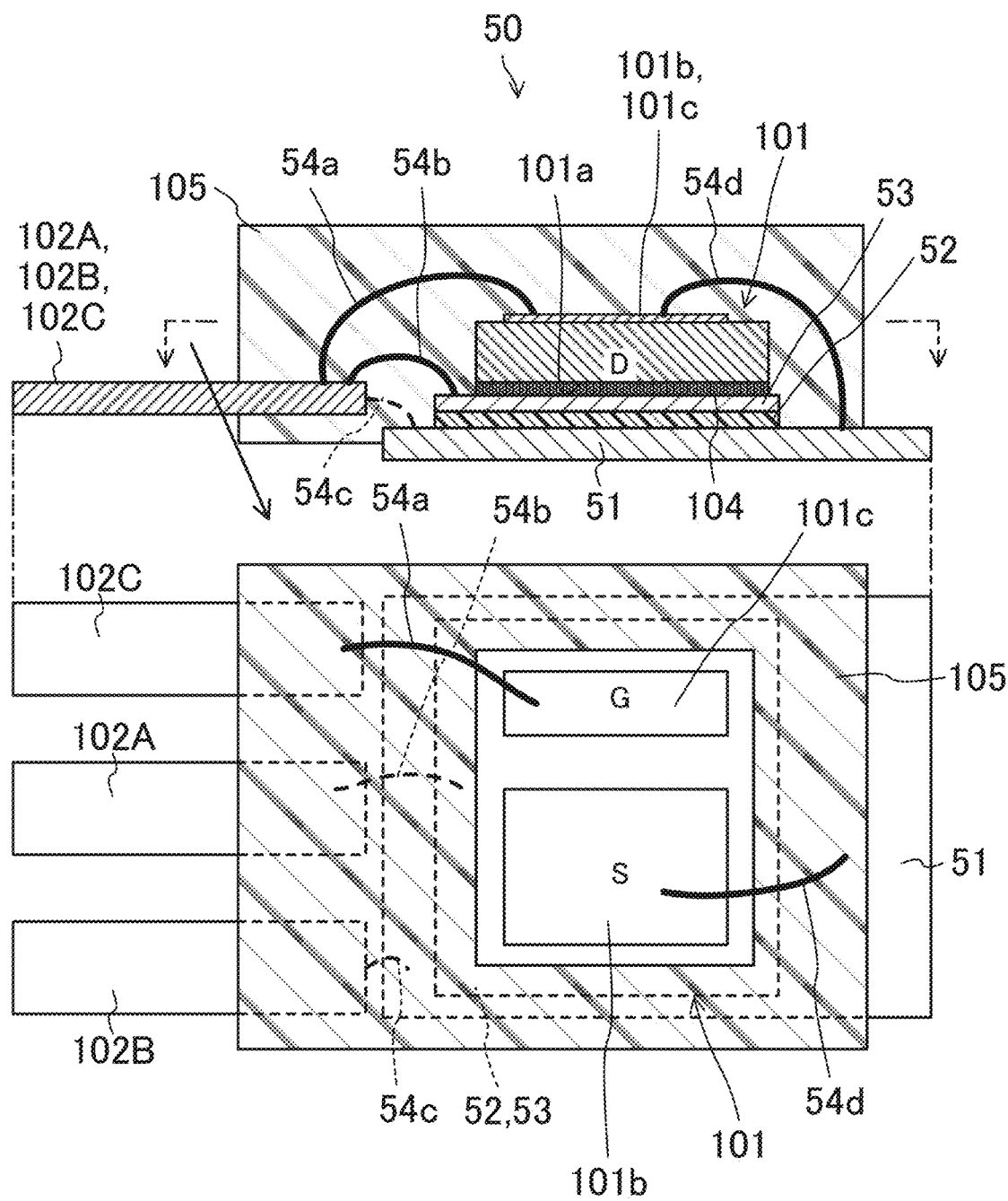
FIG. 15 is a schematic view showing a second embodiment (second improved device) of the improved device.

FIG. 15 shows a second embodiment (second improved device 50) of the improved device 1. The second improved device 50 is different from the above-described improved device 1 in a common mode current suppression structure.

Basic members etc. are the same as those of the above-described improved device 1. Thus, as in the description above, the like reference numerals are used to represent members having the like configurations, and the description thereof will be simplified or omitted. Configurations different from the above will be described in detail.

The second improved device 50 includes a semiconductor chip 101, a plurality of terminals formed of a copper lead frame, and a source fin 51. The source fin 51 is formed of a rectangular plate-shaped member, and also serves as a heat dissipation member. That is, the source fin 51 is equivalent to the drain fin 103 (heat dissipation conductor) of the improved device 1.

The common mode current suppression structure of the second improved device 50 includes an insulating layer 52 and an electrode conductor 53. The insulating layer 52 is made of a ceramic sintered material. The insulating layer 52 is joined on the source fin 51. The electrode conductor 53 is joined on the insulating layer 52. The upper surface of the electrode conductor 53 is soldered to the lower surface of a drain electrode 101a.

A gate electrode 101c is connected to a switching terminal 102C via a bonding wire 54a. A positive electrode side terminal 102A is connected to the drain electrode 101a via a bonding wire 54b and the electrode conductor 53. A negative electrode side terminal 102B is connected to the source fin 51 via a bonding wire 54c.

The source fin 51 is connected to a source electrode 101b via a bonding wire 54d.

Figure 16:
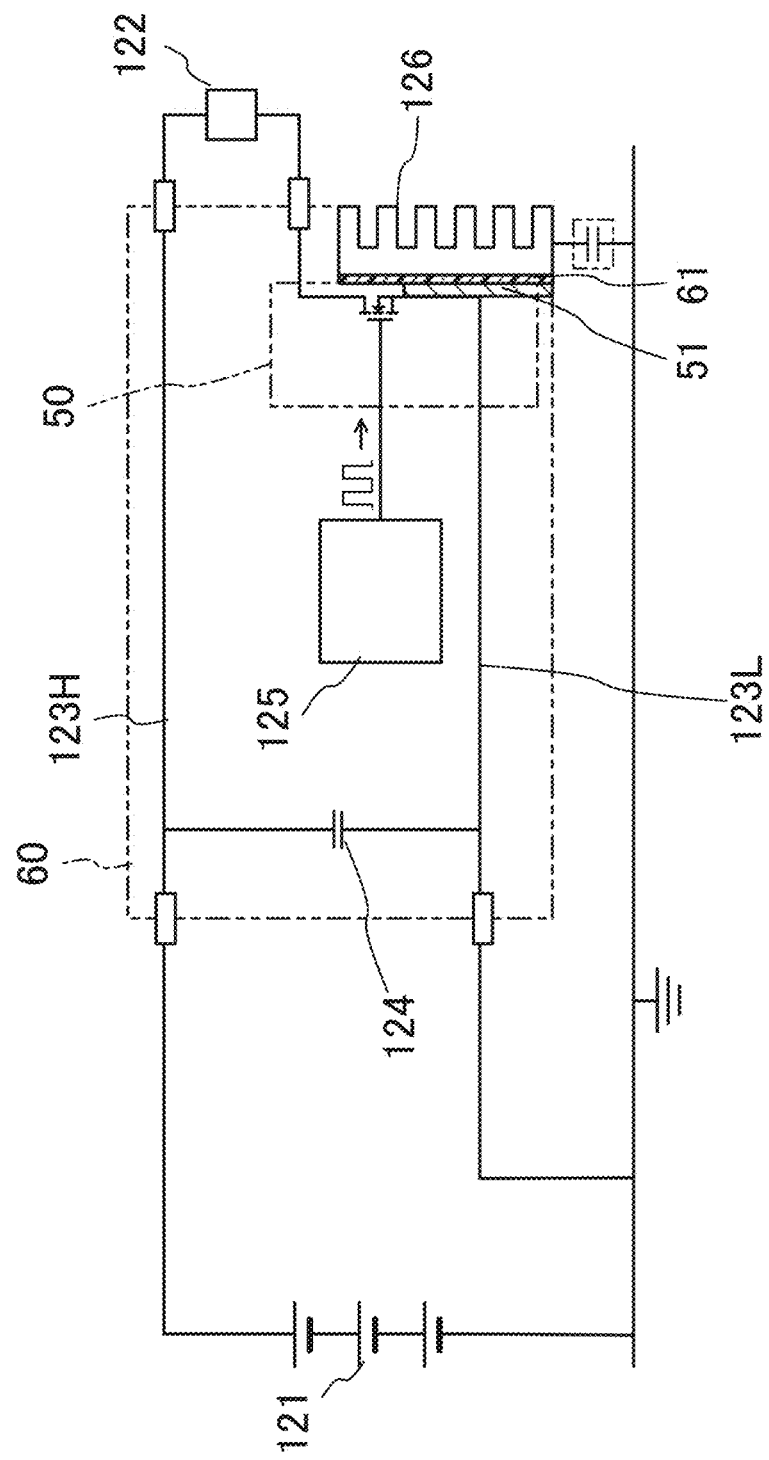
FIG. 16 is a schematic circuit diagram of a second ECU equipped with the second improved device.

FIG. 16 shows an example of a second improved ECU 60 equipped with the second improved device 50. A basic structure of the second improved ECU 60 is the same as that of the above-described improved ECU 5. The source fin 51 may be soldered to a printed wiring board, but is screwed to a heat sink 126 via an insulating sheet 61 in this embodiment.

The source fin 51 is connected to a negative electrode side line 123L, together with the negative electrode side terminal 102B. Thus, the potential of the source fin 51 is the same as the potential of the negative electrode side of a DC power source 121. Even when the second improved device 50 is turned on or off by the switching control, there is no potential difference between the source fin 51 and the heat sink 126. Thus, no common mode current flows. Thus, occurrence of common mode noise can be prevented.

The technique disclosed herein is not limited to the embodiments and also includes various other configurations. For example, a well-known semiconductor chip such as a MOSFET, a bipolar transistor, an IGBT, or GaN can be applied to the semiconductor chip 101.

The common mode current suppression structure is also one example. The arrangement, shapes, etc. of the layers may be improved in accordance with specifications as required.

The switching device and the switching module to which the technique disclosed herein is applied are suitable for in-vehicle electric devices, but are also applicable to other types of electric equipment.

DESCRIPTION OF REFERENCE CHARACTERS

1 Improved Device (Switching Device)
2 Common Mode Current Suppression Structure
2a First Insulating Layer
2b Electric conductive layer
2c Second Insulating Layer
2d Electrode Conductor
3 Bonding Wire
5 Improved ECU
11 Improved module (Switching Module)
12 Common Mode Current Suppression Structure
12a First Insulating Layer
12b Electric conductive layer
12c Second Insulating Layer
12d Electrode Conductor
13 Through-Hole
15 Improved Inverter
20 Second Improved Module
30 Third Improved Module
31 Capacitor
50 Second Improved Device
51 Source Fin
52 Insulating Layer
53 Electrode Conductor
60 Second Improved ECU
100 Unimproved Device
101 Semiconductor Chip
101a Drain Electrode (First Terminal Portion)
101b Source Electrode (Second Terminal Portion)
101c Gate Electrode (Third Terminal Portion)
102A Positive Electrode Side Terminal
102B Negative Electrode Side Terminal
102C Switching Terminal
103 Drain Fin (Heat Dissipation Conductor)
104 Solder
105 Synthetic Resin
120 Unimproved ECU
121 DC Power Source
122 Load
123H Positive Electrode Side Line (Junction Line)
123L Negative Electrode Side Line (Junction Line)
124 Smoothing Capacitor
125 Control Circuit
126 Heat Sink
127 Insulator
130 Unimproved Module
131 Case Cover
132 Heat Sink
133 Substrate
140 Switching Element (Semiconductor Chip)
140U Upper Arm Chip
140L Lower Arm Chip
140a Collector Electrode (First Terminal Portion)
140b Emitter Electrode (Second Terminal Portion)
140c Base Electrode (Third Terminal Portion)
141 Half-Bridge Circuit
142H Positive Electrode Side Line
142L Negative Electrode Side Line
142S Output Line
150 Positive Electrode Side Line Terminal Portion
151 Negative Electrode Side Line Terminal Portion
152 Output Line Terminal Portion
153 Switching Terminal Portion
170 Unimproved Inverter
171 High-Voltage Battery
172 Drive Motor
173 Control Circuit
174 Smoothing Capacitor
C1 to C8 Virtual Capacitors

What is claimed is:

1. A switching device, on which switching control is performed, the switching device comprising:
    a semiconductor chip, including:
        a first electrode, the first electrode provided on a lower surface of the semiconductor chip,
        a second electrode, the second electrode provided on an upper surface of the semiconductor chip, and
        a third electrode, the third electrode provided on the upper surface of the semiconductor chip;
    a positive electrode side terminal disposed outside the semiconductor chip and connected to the first electrode;
    a negative electrode side terminal disposed outside the semiconductor chip and connected to the second electrode;
    a switching terminal disposed outside the semiconductor chip and connected to the third electrode in order to switch whether to flow a current in a current path between the first electrode and the second electrode; and
    a heat dissipation conductor arranged below the semiconductor chip via a common mode current suppression structure, the common mode current suppression structure including:
        a first insulating layer joined on the heat dissipation conductor;
        an electric conductive layer joined on the first insulating layer;
        a second insulating layer joined on the electric conductive layer; and
        an electrode conductor joined on an upper surface of the second insulating layer and joined on a lower surface of the first electrode, wherein the electric conductive layer is electrically connected to the second electrode.

2. The switching device of claim 1, wherein materials of the first insulating layer and the second insulating layer are ceramic.

3. The switching device of claim 1, wherein materials of the first insulating layer and the second insulating layer are silicon resin.

4. The switching device of claim 1, wherein the electric conductive layer is formed by applying a material having fluidity.

5. The switching device of claim 1, wherein the electric conductive layer is a metallic thin film.

6. The switching device of claim 1, wherein the first insulating layer, the electric conductive layer, and the second insulating layer are stacked on one another.

7. A switching module, in which a switching control is performed, the switching module comprising:
- a semiconductor chip, including:
  - a half-bridge circuit including an upper arm chip and a lower arm chip connected with each other in series, and
  - an electrode provided on a lower surface of the lower arm chip; and
- a heat sink arranged below the semiconductor chip via a common mode current suppression structure, the common mode current suppression structure including:
  - a first insulating layer joined on the heat sink;
  - an electric conductive layer joined on the first insulating layer;
  - a second insulating layer joined on the electric conductive layer; and
  - an electrode conductor joined on an upper surface of the second insulating layer and joined on the lower surface of the electrode,
- wherein the electric conductive layer is electrically connected to a constant potential portion at which a predetermined potential is held.

8. The switching module of claim 7, wherein the constant potential portion is a portion of a negative electrode side line connected with the half-bridge circuit.

9. The switching module of claim 7, wherein the constant potential portion is a portion of a positive electrode side line connected with the half-bridge circuit.

10. The switching module of claim 9, further comprising:
- two capacitors connected in series between the positive electrode side line and the negative electrode side line to which the half-bridge circuit is connected,
- wherein the constant potential portion is a portion between the two capacitors.

11. The switching module of claim 7, wherein materials of the first insulating layer and the second insulating layer are ceramic.

12. The switching module of claim 7, wherein materials of the first insulating layer and the second insulating layer are silicon resin.

13. The switching module of claim 7, wherein the electric conductive layer is formed by applying a material having fluidity.

14. The switching module of claim 7, wherein the electric conductive layer is a metallic thin film.

15. The switching module of claim 7, wherein the first insulating layer, the electric conductive layer, and the second insulating layer are stacked on one another.

16. A switching device, in which switching control is performed, the switching device comprising:
- a semiconductor chip, including:
  - a first electrode, the first electrode provided on a lower surface of the semiconductor chip,
  - a second electrode, the second electrode provided on an upper surface of the semiconductor chip, and
  - a third electrode, the third electrode provided on the upper surface of the semiconductor chip;
- a positive electrode side terminal disposed outside the semiconductor chip and connected to the first electrode;
- a negative electrode side terminal disposed outside the semiconductor chip and connected to the second electrode;
- a switching terminal disposed outside the semiconductor chip and connected to the third electrode to switch whether to flow a current in a current path between the first electrode and the second electrode; and
- a heat dissipation conductor arranged below the semiconductor chip via a common mode current suppression structure, the common mode current suppression structure including:
  - an insulating layer joined on the heat dissipation conductor; and
  - an electrode conductor joined on an upper surface of the insulating layer and joined on a lower surface of the first electrode,
- wherein the heat dissipation conductor is electrically connected to the second electrode.

17. The switching device of claim 1, wherein the common mode current suppression structure is disposed outside of the semiconductor chip.

18. The switching module of claim 7, wherein the common mode current suppression structure is disposed outside of the semiconductor chip.

19. The switching device of claim 16, wherein the common mode current suppression structure is disposed outside of the semiconductor chip.

* * * * *